United States Patent
Chiu et al.

(10) Patent No.: US 9,780,236 B2
(45) Date of Patent: Oct. 3, 2017

(54) CONDUCTIVE PASTE COMPOSITION AND METHOD FOR MANUFACTURING ELECTRODE

(71) Applicant: INDUSTRIAL TECHNOLOGY RESEARCH INSTITUTE, Hsinchu (TW)

(72) Inventors: Chun-Yi Chiu, Hsinchu (TW); Kuo-Chan Chiou, Tainan (TW); Wei-Han Hsiao, New Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 115 days.

(21) Appl. No.: 14/553,181

(22) Filed: Nov. 25, 2014

(65) Prior Publication Data
US 2015/0171238 A1    Jun. 18, 2015

(30) Foreign Application Priority Data

Dec. 17, 2013  (TW) .............................. 102146538 A

(51) Int. Cl.
| | |
|---|---|
| H01B 1/02 | (2006.01) |
| H01L 31/0224 | (2006.01) |
| C09D 5/24 | (2006.01) |
| C09J 9/02 | (2006.01) |
| H01B 1/22 | (2006.01) |
| H01B 1/24 | (2006.01) |
| B22F 1/00 | (2006.01) |
| C22C 32/00 | (2006.01) |
| C09J 11/04 | (2006.01) |
| C08K 3/04 | (2006.01) |
| C08K 3/08 | (2006.01) |

(52) U.S. Cl.
CPC .... *H01L 31/022425* (2013.01); *B22F 1/0014* (2013.01); *C09D 5/24* (2013.01); *C09J 9/02* (2013.01); *C09J 11/04* (2013.01); *C22C 32/0089* (2013.01); *H01B 1/22* (2013.01); *H01B 1/24* (2013.01); *B22F 2999/00* (2013.01); *C08K 3/04* (2013.01); *C08K 2003/085* (2013.01); *C08K 2003/0806* (2013.01); *C08K 2201/001* (2013.01)

(58) Field of Classification Search
CPC .................................... H01B 1/22; H01B 1/16
USPC .................... 252/500, 514; 136/256
See application file for complete search history.

(56) References Cited

U.S. PATENT DOCUMENTS

| | | |
|---|---|---|
| 7,122,585 B2 | 10/2006 | Nicholl et al. |
| 7,554,793 B2 | 6/2009 | Chacko |
| 7,976,735 B2 | 7/2011 | Akimoto |
| 8,148,630 B2 | 4/2012 | Akimoto |
| 8,178,007 B2 | 5/2012 | Akimoto |
| 8,455,753 B2 | 6/2013 | Nishi et al. |
| 2004/0235984 A1 | 11/2004 | Nicholl et al. |
| 2006/0157105 A1 | 7/2006 | Nishi et al. |
| 2008/0053922 A1 | 3/2008 | Honsinger, Jr. et al. |
| 2008/0116416 A1 | 5/2008 | Chacko |
| 2009/0211626 A1 | 8/2009 | Akimoto |
| 2010/0170567 A1 | 7/2010 | Akimoto |
| 2010/0276645 A1 | 11/2010 | Aspin et al. |
| 2011/0117202 A1 | 5/2011 | Bourke, Jr. et al. |
| 2011/0148248 A1 | 6/2011 | Landa |
| 2011/0180139 A1 | 7/2011 | Adachi et al. |
| 2011/0216020 A1 | 9/2011 | Lee et al. |
| 2011/0223712 A1 | 9/2011 | Akimoto |
| 2011/0223713 A1 | 9/2011 | Akimoto |
| 2011/0315217 A1 | 12/2011 | Gee |
| 2012/0161196 A1 | 6/2012 | Lowenthal et al. |
| 2012/0186644 A1 | 7/2012 | Ko et al. |
| 2012/0231571 A1 | 9/2012 | Iida et al. |
| 2012/0251381 A1 | 10/2012 | Bedworth et al. |
| 2012/0325737 A1 | 12/2012 | Lee et al. |
| 2013/0050694 A1 | 2/2013 | Janssen et al. |
| 2013/0087200 A1 | 4/2013 | Xue et al. |
| 2013/0125970 A1 | 5/2013 | Ko et al. |
| 2013/0187101 A1* | 7/2013 | Rajendran ........... H01L 31/0224 252/514 |
| 2013/0306144 A1* | 11/2013 | Lee ......................... H01B 1/22 136/256 |

FOREIGN PATENT DOCUMENTS

| | | | |
|---|---|---|---|
| AU | 2009286292 A1 | 3/2010 | |
| CA | 2 732 712 A1 | 3/2010 | |
| CN | 1825654 A | 8/2006 | |
| CN | 101622324 A | 1/2010 | |
| CN | 101918505 A | 12/2010 | |
| CN | 101928540 A | 12/2010 | |
| CN | 101952904 A | 1/2011 | |
| CN | 102318179 A | 1/2012 | |
| CN | 102610297 A | 7/2012 | |
| CN | 102934174 A | 2/2013 | |
| CN | 103117110 A * | 5/2013 | ............... H01B 1/16 |
| CN | 103229314 A | 7/2013 | |
| EP | 0 625 722 A2 | 11/1994 | |
| EP | 2 295 513 A2 | 3/2011 | |
| EP | 2 295 514 A2 | 3/2011 | |

(Continued)

OTHER PUBLICATIONS

Extended European Search Report for Appl. No. 14196255.5 dated Dec. 15, 2015.

(Continued)

*Primary Examiner* — Khanh Tuan Nguyen
(74) *Attorney, Agent, or Firm* — Birch, Stewart, Kolasch & Birch, LLP

(57) ABSTRACT

Disclosed is a conductive paste composition, including 100 parts by weight of copper powder, 40 to 150 parts by weight of silver powder, 0.1 to 3 parts by weight of carbon powder, 1 to 5 parts by weight of glass powder, and 5 to 15 parts by weight of binder. The conductive paste composition can be applied on a substrate, and then sintered under atmosphere at a high temperature to form an electrode on the substrate.

6 Claims, No Drawings

(56) References Cited

FOREIGN PATENT DOCUMENTS

| | | | |
|---|---|---|---|
| ES | 2 375 542 T3 | 3/2012 | |
| GB | 2463117 A | 3/2010 | |
| JP | 2005-129424 A | 5/2005 | |
| JP | 2011-519150 A | 6/2011 | |
| JP | 2012-504927 A | 2/2012 | |
| JP | 2012-109148 A | 6/2012 | |
| JP | 2012-221703 A | 11/2012 | |
| JP | 5120477 B2 | 1/2013 | |
| JP | 2013-025991 * | 2/2013 | ............ Y02E 10/50 |
| KR | 10-2006-0083164 A | 7/2006 | |
| KR | 10-2010-0120218 A | 11/2010 | |
| KR | 10-2011-0058799 A | 6/2011 | |
| KR | 10-2013-0014599 A | 2/2013 | |
| MX | 2011002281 A | 5/2011 | |
| RU | 2011 111 135 A | 10/2012 | |
| TW | 200952190 A1 | 12/2009 | |
| TW | 201017941 A1 | 5/2010 | |
| TW | 201113940 A1 | 4/2011 | |
| TW | 201211435 A1 | 3/2012 | |
| TW | 201219536 A1 | 5/2012 | |
| TW | 201240750 A | 10/2012 | |
| TW | 201251066 A1 | 12/2012 | |
| TW | I392100 B | 4/2013 | |
| TW | 201331352 A1 | 8/2013 | |
| WO | WO 2008/067198 A2 | 6/2008 | |
| WO | WO 2008/146014 A2 | 12/2008 | |
| WO | WO 2009/108675 A1 | 9/2009 | |
| WO | WO 2010/023669 A2 | 3/2010 | |
| WO | WO 2011/149165 A1 | 12/2011 | |
| WO | WO 2012/047404 A1 | 4/2012 | |
| WO | WO 2012/137688 A1 | 10/2012 | |
| WO | WO 2013/073478 A1 | 5/2013 | |

OTHER PUBLICATIONS

Chinese Office Action and Search Report, dated Apr. 15, 2016, for Chinese Application No. 201410338391.8.
Liu et al., "Reduction of copper oxide with graphite by mechanical alloying", Journal of Materials Research, vol. 14, No. 10, Oct. 1999, pp. 4062-4069.
Luechinger et al., "Graphene-stabilized copper nanoparticles as an air-stable substitute for silver and gold in low-cost ink-jet printable electronics", Nanotechnology, vol. 19, 2008, 445201, pp. 1-6.
Magdassi et al., "Copper Nanoparticles for Printed Electronics: Routes Towards Achieving Oxidation Stability", Materials, vol. 3, 2010, pp. 4626-4638.
Office Action issued in Taiwanese Application No. 102146538, dated Nov. 18, 2014.
Wang et al., "Synthesis, growth mechanism and thermal stability of copper nanoparticles encapsulated by multi-layer graphene", Elsevier, Carbon 50, 2012, pp. 2119-2125.

\* cited by examiner

CONDUCTIVE PASTE COMPOSITION AND METHOD FOR MANUFACTURING ELECTRODE

CROSS REFERENCE TO RELATED APPLICATIONS

The present application is based on, and claims priority from, Taiwan Application Serial Number 102146538, filed on Dec. 17, 2013, the disclosure of which is hereby incorporated by reference herein in its entirety.

TECHNICAL FIELD

The technical field relates to a conductive paste composition, and in particular to an application of a conductive paste composition.

BACKGROUND

Conductive pastes are composite materials prepared from binders (e.g. resin) and conductive fillers (e.g. metal), which are well-known in the electronic industry. Such conductive pastes are simultaneously conductive (from the metal), and adhesive and viscous (from the resin), and the above properties can be adjusted according to process requirements. The conductivity of the conductive pastes depends on the type, shape, and size of the conductive fillers (such as metal powder). The conductive pastes with more contact area between the conductive fillers have a higher conductivity. Typical conductive pastes have a high content (>75 wt %) of conductive fillers interconnecting each other in an organic resin binder. After adhering or curing the conductive paste by thermal pressing, the conductive fillers may form a network link to form a contact with a top electrode and a bottom electrode, thereby forming a current path for signal transmission.

The conductive pastes are critical materials in electronic device packages, electrodes, and interconnect structures. The conductive pastes are usually classified into two major types: the high-temperature sintering type and the low-temperature curing types. The conductive pastes of the sintering type are often used in the solar-cell industry, and the conductive pastes of the curing type are widely used in printed circuits and electronic packages. Copper powder is an excellent conductive filler for the conductive paste, however, it is easily oxidized at temperatures of 200° C. and higher. As such, special conditions are required when sintering conductive pastes containing copper to form electrodes, such as performing the process under an inert gas (e.g. nitrogen) environment to prevent the copper from oxidizing.

Accordingly, a novel conductive paste composition with decreased copper oxidation is called for.

SUMMARY

One embodiment of the disclosure provides a conductive paste composition comprising: 100 parts by weight of copper powder; 40 to 150 parts by weight of silver powder; 0.1 to 3 parts by weight of carbon powder; 1 to 5 parts by weight of glass powder; and 5 to 15 parts by weight of binder.

One embodiment of the disclosure provides a method for manufacturing an electrode, comprising: applying the described conductive paste composition onto a substrate; and sintering the conductive paste composition under a normal atmosphere to form an electrode on the substrate.

A detailed description is given in the following embodiments.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details.

The conductive paste composition of the disclosure includes 100 parts by weight of copper powder, about 40 to 150 parts by weight of silver powder, about 0.1 to 3 parts by weight of carbon powder, about 1 to 5 parts by weight of glass powder, and about 5 to 15 parts by weight of binder. When the conductive paste is sintered at a high temperature, the carbon powder in the conductive paste composition may inhibit the oxidation of the copper and chemically reduce the generation of copper oxide. As such, an electrode with low resistivity is formed.

In one embodiment of the disclosure, the copper powder has a particle size of 1 µm to 10 µm. A copper powder having an overly large particle size may block the screen during printing and lower the delicate degree of the printed pattern. The copper powder having an overly small particle size will be easily oxidized due to its high specific surface area. In addition, the copper powder has a particle size larger than that of the silver powder. If the silver powder has a particle size that is equal to or greater than that of the copper powder, the silver powder cannot efficiently wrap the surface of the copper powder, thereby failing to insulate oxidation of the copper powder.

In one embodiment of the disclosure, the silver powder has a particle size of about 0.1 µm to 2 µm. A silver powder having an overly large particle size cannot efficiently wrap the surface of the copper powder. A silver powder having an overly small particle size is easily aggregated, and is difficult to be dispersed. In addition, an overly high amount of the silver powder will greatly increase the cost of the conductive paste. An overly low amount of the silver powder cannot form an electrode with sufficient conductivity by sintering the conductive paste at a high temperature.

In one embodiment of the disclosure, the carbon powder can be graphene, active carbon, carbon nanotube, artificial graphite, or natural graphite. In one embodiment, the carbon powder has a specific surface area of about 200 $m^2/g$ to 1000 $m^2/g$. A carbon powder having an overly low specific surface area cannot efficiently inhibit the oxidation of copper during the sintering of the conductive paste at a high temperature. In addition, an overly high amount of carbon powder will reduce the conductivity of the electrode formed by sintering the conductive paste. An overly low amount of carbon powder cannot efficiently inhibit the oxidation of copper during the sintering of the conductive paste at a high temperature.

In one embodiment, the glass powder has a softening point that is lower than or equal to 600° C. and a crystallization onset temperature that is higher than 600° C. The glass powder can be BBG-3 or VBP commercially available from Okamoto Glass Co., Ltd.

In one embodiment of the disclosure, the binder includes epoxy resin and hardener. For example, the epoxy resin can be bisphenol epoxy resin, o-cresol novolac epoxy resin, cycloaliphatic epoxy resin, or another suitable epoxy resin. For example, the bisphenol epoxy resin can be EPON 828 commercially available from Shell Company, H-4032D commercially available from DIC Company, or EXA-830LVP commercially from DIC Company. The o-cresol novolac epoxy resin can be CNE 202 commercially available from Chang Chun Chemical. The cycloaliphatic epoxy resin can be ERL 4221E or ERL 4206 commercially available from U.C. company, EPALLOY™ 5200 commercially available from CVC company, or EPALLOY™ 5001 commercially available from CVC company. Other epoxy resins may be GS120 commercially available from CVC Company, or GE20 commercially available from CVC Company. The hardener can be amine hardener, acid anhydride hardener, cationic hardener, or combinations thereof. The amine hardener can be D230, D400, or D2000 commercially available from Huntsman Company, or combinations thereof. The acid anhydride hardener can be MHHPA-MW, MTHPA, or NMA commercially available from Lonza Company, or combinations thereof. The cationic hardener can be SI-45, SI-60, SI-B2A, SI-B3, or SI-B3A commercially available from Sanshin Chemical Industry co., Ltd, or combinations thereof. In one embodiment, the binder may further include reaction promoter to reduce the curing temperature of the epoxy resin. The reaction promoter can be SA102 commercially available from SAN-APRO, 2E4MZ commercially available from TCI, or TMAH commercially available from Aldrich.

In another embodiment, solvent, thickener, dispersant, thixotropic agent, defoamer, or combinations thereof can be added into the conductive paste composition to improve the processability of the conductive paste.

In one embodiment, the conductive paste is applied onto a substrate, and then sintered under a normal atmosphere at a high temperature to form an electrode on the substrate. In one embodiment, the substrate should resist the high temperature sintering, like a ceramic substrate or silicon wafer. The high temperature required for sintering is about 500° C. to 900° C., about 600° C. to 900° C., or about 700° C. to 900° C. After sintering the conductive paste at a high temperature, an electrode with high conductivity and low resistance is formed, for application as the surface electrode of a solar cell (or other devices manufactured by a high-temperature process). Because the carbon powder may inhibit the oxidation of copper and chemically reduce the generation of copper oxide, the high temperature sintering can be performed under a normal atmosphere, rather than under an inert gas or a chemically reducing atmosphere. As such, the sintering step is simplified.

Below, exemplary embodiments will be described in detail so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

EXAMPLES

Example 1

16.76 g of EPON 828, 52.6 g of ERL 4221E, 57.92 g of MHHPA-MW, and 0.694 g of tetramethylammonium hydroxide (TMAH) were mixed to form a binder A. 70 g of copper powder (mean particle size of 10 μm, commercially available from DOWA), 30 g of silver powder (mean particle size of 2.0 μm, commercially available from Ferro), 5 g of glass powder (mean particle size of 3.0 μm, commercially available from Okamoto Glass Co., Ltd.), and 0.1 g of graphene (specific surface area of about 500 m²/g, prepared according to H. A. Becerill, J. Mao, Z. Liu, R. M. Stoltenberg, Z. Bao, and Y. Chen, ACS Nano 2, 463 (2008)) were mixed with 15 g of the binder A by high-speed stiffing. The mixture was then milled and dispersed to form a conductive paste. The conductive paste was screen printed on a polysilicon substrate, and then sintered in an oven at 800° C. for 30 minutes to form an electrode on the substrate. The adhesive force between the electrode and the substrate was 5 B. The volume resistivity of the electrode is shown in Table 1.

Example 2

Example 2 was similar to Example 1. The difference between Examples 1 and 2 was the graphene amount being increased to 0.5 g in Example 2. The amounts of the copper power, the silver powder, the glass powder, and the binder were similar to those in Example 1. The steps of mixing, milling and dispersing, printing, and sintering to form the electrode were similar to those in Example 1. The adhesive force between the electrode and the substrate was 5 B. The volume resistivity of the electrode is tabulated in Table 1.

Example 3

Example 3 was similar to Example 1. The differences between Examples 1 and 3 were the copper powder in Example 3 being changed to another copper powder (particle size of 4.7 μm, Cu-HWQ commercially available from Fukuda), the silver powder in Example 3 being changed to another silver powder (particle size of 0.8 μm, AG-2-1C commercially available from DOWA), and the graphene in Example 1 being replaced by a carbon nanotube (specific surface area of about 200 m²/g, MWCNT commercially available from Seedchem Company Pty., Ltd.) in Example 3. The amounts of the copper powder, the silver powder, the glass powder, and the binder were similar to those in Example 1. The steps of mixing, milling and dispersing, printing, and sintering to form the electrode were similar to those in Example 1. The adhesive force between the electrode and the substrate was 5 B. The volume resistivity of the electrode is tabulated in Table 1.

Example 4

Example 4 was similar to Example 1. The differences between Examples 1 and 4 were the copper powder in Example 4 being changed to another copper powder (particle size of 4.7 μm, Cu-HWQ commercially available from Fukuda), the silver powder in Example 4 being changed to another silver powder (particle size of 0.8 μm, AG-2-1C commercially available from DOWA), and 0.1 g of the graphene in Example 1 being replaced by 0.5 g of carbon nanotube (specific surface area of about 200 m²/g, MWCNT commercially available from Seedchem Company Pty., Ltd.) in Example 4. The amounts of the copper power, the silver powder, the glass powder, and the binder were similar to those in Example 1. The steps of mixing, milling and dispersing, printing, and sintering to form the electrode were similar to those in Example 1. The adhesive force between the electrode and the substrate was 5 B. The volume resistivity of the electrode is tabulated in Table 1.

Comparative Example 1

Comparative Example 1 was similar to Example 1. The difference between Example 1 and Comparative Example 1 was the graphene in Example 1 being omitted in Comparative Example 1. The amounts of the copper power, the silver powder, the glass powder, and the binder were similar to those in Example 1. The steps of mixing, milling and dispersing, printing, and sintering to form the electrode were similar to those in Example 1. The adhesive force between the electrode and the substrate was 5 B. The volume resistivity of the electrode is tabulated in Table 1.

Comparative Example 2

Comparative Example 2 was similar to Example 1. The difference between Examples 1 and Comparative Example 2 was the graphene in Example 1 being replaced by graphite (specific surface area of about 20 $m^2/g$, KS-6 commercially available from TIMCAL graphite) in Comparative Example 2. The amounts of the copper power, the silver powder, the glass powder, and the binder were similar to those in Example 1. The steps of mixing, milling and dispersing, printing, and sintering to form the electrode were similar to those in Example 1. The adhesive force between the electrode and the substrate was 5 B. The volume resistivity of the electrode is tabulated in Table 1.

Comparative Example 3

Comparative Example 3 was similar to Example 1. The difference between Examples 1 and Comparative Example 3 was 0.1 g of the graphene in Example 1 being replaced by 0.5 g of the graphite (specific surface area of about 20 $m^2/g$, KS-6 commercially available from TIMCAL graphite) in Comparative Example 3. The amounts of the copper power, the silver powder, the glass powder, and the binder were similar to those in Example 1. The steps of mixing, milling and dispersing, printing, and sintering to form the electrode were similar to those in Example 1. The adhesive force between the electrode and the substrate was 5 B. The volume resistivity of the electrode is tabulated in Table 1.

graphite with low specific surface area could not reduce the volume resistivity of the electrode made from the conductive pastes.

Example 5

20 g of EPALLOY™ 5200, 20 g of ERL 4221E, and 1.2 g of SI-60 were mixed to form a binder B. 50 g of copper powder (mean particle size of 10 μm, commercially available from DOWA), 50 g of silver powder (mean particle size of 2.0 μm, commercially available from Ferro), 5 g of glass powder (mean particle size of 3.0 μm, commercially available from Okamoto Glass Co., Ltd.), and 0.1 g of graphene (specific surface area of about 500 $m^2/g$, prepared according to H. A. Becerill, J. Mao, Z. Liu, R. M. Stoltenberg, Z. Bao, and Y. Chen, ACS Nano 2, 463 (2008)) were mixed with 15 g of the binder B by high-speed stirring. The mixture was then milled and dispersed to form a conductive paste. The conductive paste was screen printed on a polysilicon substrate, and then sintered in an oven at 800° C. for 30 minutes to form an electrode on the substrate. The adhesive force between the electrode and the substrate was 5 B. The volume resistivity of the electrode is tabulated in Table 2.

Example 6

Example 6 was similar to Example 5. The difference between Examples 5 and 6 was the graphene amount being increased to 0.2 g in Example 6. The amounts of the copper power, the silver powder, the glass powder, and the binder were similar to those in Example 5. The steps of mixing, milling and dispersing, printing, and sintering to form the electrode were similar to those in Example 5. The adhesive force between the electrode and the substrate was 5 B. The volume resistivity of the electrode is tabulated in Table 2.

Comparative Example 4

Comparative Example 4 was similar to Example 5. The difference between Example 5 and Comparative Example 4 was the graphene in Example 5 being omitted in Comparative Example 4. The amounts of the copper power, the silver

TABLE 1

| | Silver powder (g) | Copper powder (g) | Additive | Additive ratio (on the basis of the copper powder) | Glass powder (g) | Binder (g) | Volume resistivity (μΩ-cm) |
|---|---|---|---|---|---|---|---|
| Example 1 | 30 | 70 | Graphene (0.1 g) | 0.14% | 5 | 15 | 297 |
| Example 2 | 30 | 70 | Graphene (0.5 g) | 0.71% | 5 | 15 | 88 |
| Example 3 | 30 | 70 | Carbon nanotube (0.1 g) | 0.14% | 5 | 15 | 222 |
| Example 4 | 30 | 70 | Carbon nanotube (0.5 g) | 0.71% | 5 | 15 | 107 |
| Comparative Example 1 | 30 | 70 | None | 0% | 5 | 15 | 460 |
| Comparative Example 2 | 30 | 70 | Graphite (0.1 g) | 0.14% | 5 | 15 | 523 |
| Comparative Example 3 | 30 | 70 | Graphite (0.5 g) | 0.71% | 5 | 15 | 445 |

As shown in Table 1, not only the graphene but also the carbon nanotube (with a high specific surface area) could reduce the volume resistivity of the electrode made from the conductive pastes. Furthermore, not all carbon material could be utilized to reduce the volume resistivity of the electrode made from the conductive pastes. For example, the powder, the glass powder, and the binder were similar to those in Example 5. The steps of mixing, milling and dispersing, printing, and sintering to form the electrode were similar to those in Example 5. The adhesive force between the electrode and the substrate was 5 B. The volume resistivity of the electrode is tabulated in Table 2.

TABLE 2

| | Silver powder (g) | Copper powder (g) | Additive | Additive ratio (on the basis of the copper powder) | Glass powder (g) | Binder (g) | Volume resistivity ($\mu\Omega$-cm) |
|---|---|---|---|---|---|---|---|
| Example 5 | 50 | 50 | Graphene (0.1 g) | 0.20% | 5 | 15 | 111 |
| Example 6 | 50 | 50 | Graphene (0.2 g) | 0.40% | 5 | 15 | 92 |
| Comparative Example 4 | 50 | 50 | — | — | 5 | 15 | 374 |

As shown in Table 2, graphene may reduce the volume resistivity of the electrode made from the conductive pastes.

Example 7

40 g of copper powder (mean particle size of 10 µm, commercially available from DOWA), 60 g of silver powder (mean particle size of 2.0 µm, commercially available from Ferro), 5 g of glass powder (mean particle size of 3.0 µm, commercially available from Okamoto Glass Co., Ltd.), and 0.1 g of graphene (specific surface area of about 500 m²/g, prepared according to H. A. Becerill, J. Mao, Z. Liu, R. M. Stoltenberg, Z. Bao, and Y. Chen, ACS Nano 2, 463 (2008)) were mixed with 15 g of the binder A in Example 1 by high-speed stirring. The mixture was then milled and dispersed to form a conductive paste. The conductive paste was screen printed on a polysilicon substrate, and then sintered in an oven at 800° C. for 30 minutes to form an electrode on the substrate. The adhesive force between the electrode and the substrate was 5 B. The volume resistivity of the electrode is tabulated in Table 3.

Example 8

Example 8 was similar to Example 7. The difference between Examples 7 and 8 was the graphene amount being increased to 0.2 g in Example 8. The amounts of the copper power, the silver powder, the glass powder, and the binder were similar to those in Example 7. The steps of mixing, milling and dispersing, printing, and sintering to form the electrode were similar to those in Example 7. The adhesive force between the electrode and the substrate was 5 B. The volume resistivity of the electrode is tabulated in Table 3.

Example 9

Example 9 was similar to Example 7. The differences between Examples 7 and 9 were the copper powder in Example 9 being changed to another copper powder (particle size of 4.7 µm, Cu-HWQ commercially available from Fukuda), the silver powder in Example 9 being changed to another silver powder (particle size of 0.8 µm, AG-2-1C commercially available from DOWA), and 0.1 g of the graphene in Example 7 being replaced by 0.5 g of carbon nanotube (specific surface area of about 200 m²/g, MWCNT commercially available from Seedchem Company Pty., Ltd.) in Example 9. The amounts of the copper power, the silver powder, the glass powder, and the binder were similar to those in Example 7. The steps of mixing, milling and dispersing, printing, and sintering to form the electrode were similar to those in Example 7. The adhesive force between the electrode and the substrate was 5 B. The volume resistivity of the electrode is tabulated in Table 3.

Example 10

Example 10 was similar to Example 7. The differences between Examples 7 and 10 were the copper powder in Example 10 being changed to another copper powder (particle size of 4.7 µm, Cu-HWQ commercially available from Fukuda), the silver powder in Example 10 being changed to another silver powder (particle size of 0.8 µm, AG-2-1C commercially available from DOWA), and 0.1 g of the graphene in Example 7 being replaced by 0.2 g of carbon nanotube (specific surface area of about 200 m²/g, MWCNT commercially available from Seedchem Company Pty., Ltd.) in Example 10. The amounts of the copper power, the silver powder, the glass powder, and the binder were similar to those in Example 7. The steps of mixing, milling and dispersing, printing, and sintering to form the electrode were similar to those in Example 7. The adhesive force between the electrode and the substrate was 5 B. The volume resistivity of the electrode is tabulated in Table 3.

Comparative Example 5

Comparative Example 5 was similar to Example 7. The difference between Example 7 and Comparative Example 5 was the graphene in Example 7 being omitted in Comparative Example 5. The amounts of the copper power, the silver powder, the glass powder, and the binder were similar to those in Example 7. The steps of mixing, milling and dispersing, printing, and sintering to form the electrode were similar to those in Example 7. The adhesive force between the electrode and the substrate was 5 B. The volume resistivity of the electrode is tabulated in Table 3.

Comparative Example 6

Comparative Example 6 was similar to Example 7. The difference between Example 7 and Comparative Example 6 was the 0.1 g of the graphene in Example 7 being replaced by 3 g of nickel powder (commercially available from Force Applied Material Tech Co.) in Comparative Example 6. The amounts of the copper power, the silver powder, the glass powder, and the binder were similar to those in Example 7. The steps of mixing, milling and dispersing, printing, and sintering to form the electrode were similar to those in Example 7. The adhesive force between the electrode and the substrate was 5 B. The volume resistivity of the electrode is tabulated in Table 3.

Comparative Example 7

Comparative Example 7 was similar to Example 7. The difference between Example 7 and Comparative Example 7 was the 0.1 g of the graphene in Example 7 being replaced by 3 g of aluminum powder (commercially available from Force Applied Material Tech Co.) in Comparative Example 7. The amounts of the copper power, the silver powder, the glass powder, and the binder were similar to those in Example 7. The steps of mixing, milling and dispersing, printing, and sintering to form the electrode were similar to those in Example 7. The adhesive force between the electrode and the substrate was 5 B. The volume resistivity of the electrode is tabulated in Table 3.

Comparative Example 8

Comparative Example 8 was similar to Example 7. The difference between Example 7 and Comparative Example 8 was the 0.1 g of the graphene in Example 7 being replaced by 0.1 g of graphite (specific surface area of about 20 $m^2/g$, KS-6 commercially available from TIMCAL graphite) in Comparative Example 8. The amounts of the copper power, the silver powder, the glass powder, and the binder were similar to those in Example 7. The steps of mixing, milling and dispersing, printing, and sintering to form the electrode were similar to those in Example 7. The adhesive force between the electrode and the substrate was 5 B. The volume resistivity of the electrode is tabulated in Table 3.

Comparative Example 9

Comparative Example 9 was similar to Example 7. The difference between Example 7 and Comparative Example 9 was the 0.1 g of the graphene in Example 7 being replaced by 0.5 g of graphite (specific surface area of about 20 $m^2/g$, KS-6 commercially available from TIMCAL graphite) in Comparative Example 9. The amounts of the copper power, the silver powder, the glass powder, and the binder were similar to those in Example 7. The steps of mixing, milling and dispersing, printing, and sintering to form the electrode were similar to those in Example 7. The adhesive force between the electrode and the substrate was 5 B. The volume resistivity of the electrode is tabulated in Table 3.

Comparative Example 10

Comparative Example 10 was similar to Example 7. The difference between Example 7 and Comparative Example 10 was the 0.1 g of the graphene in Example 7 being replaced by 10 g of graphite (specific surface area of about 20 $m^2/g$, KS-6 commercially available from TIMCAL graphite) in Comparative Example 8. The amounts of the copper power, the silver powder, the glass powder, and the binder were similar to those in Example 7. The steps of mixing, milling and dispersing, printing, and sintering to form the electrode were similar to those in Example 7. The adhesive force between the electrode and the substrate was 5 B. The volume resistivity of the electrode is tabulated in Table 3.

As shown in Table 3, not only the graphene but also the carbon nanotube with a high specific surface area could reduce the volume resistivity of the electrode made from the conductive paste. In addition, not all carbon material could be utilized to reduce the volume resistivity of the electrode made from conductive paste. Furthermore, the metal powder, such as nickel powder or aluminum powder, could not reduce the volume resistivity of the electrode made from the conductive paste.

Comparative Example 11

40 g of copper powder (mean particle size of 0.1 μm, prepared according to H. T. Zhu et al., Journal of Crystal Growth, 270, 722 (2004)), 60 g of silver powder (mean particle size of 2.0 μm, commercially available from Ferro), and 5 g of glass powder (mean particle size of 3.0 μm, commercially available from Okamoto Glass Co., Ltd.) were mixed with 15 g of the binder A in Example 1 by high-speed stiffing. The mixture was then milled and dispersed to form a conductive paste. The conductive paste was screen printed on a polysilicon substrate, and then sintered in an oven at 800° C. for 30 minutes to form an electrode on the substrate. The adhesive force between the electrode and the substrate was 5 B. The volume resistivity of the electrode is tabulated in Table 4.

Comparative Example 12

40 g of copper powder (mean particle size of 0.1 μm, prepared according to H. T. Zhu et al., Journal of Crystal Growth, 270, 722 (2004)), 60 g of silver powder (mean particle size of 2.0 μm, commercially available from Ferro), 5 g of glass powder (mean particle size of 3.0 μm, commercially available from Okamoto Glass Co., Ltd.), and 0.5 g of carbon nanotube (specific surface area of about 200 $m^2/g$, MWCNT commercially available from Seedchem Company Pty., Ltd.) were mixed with 15 g of the binder A in Example 1 by high-speed stirring. The mixture was then milled and dispersed by a three roll mill 3 times to form a conductive paste. The conductive paste was screen printed on a polysilicon substrate, and then sintered in an oven at 800° C. for 30 minutes to form an electrode on the substrate. The adhesive force between the electrode and the substrate was 5 B. The volume resistivity of the electrode is tabulated in Table 4.

TABLE 3

| | Silver powder (g) | Copper powder (g) | Additive | Additive ratio (on the basis of the copper powder) | Glass powder (g) | Binder (g) | Volume resistivity (μΩ-cm) |
|---|---|---|---|---|---|---|---|
| Example 7 | 60 | 40 | Graphene (0.1 g) | 0.25% | 5 | 15 | 52 |
| Example 8 | 60 | 40 | Graphene (0.2 g) | 0.50% | 5 | 15 | 35 |
| Example 9 | 60 | 40 | CNT (0.1 g) | 0.25% | 5 | 15 | 50 |
| Example 10 | 60 | 40 | CNT (0.2 g) | 0.50% | 5 | 15 | 41 |
| Comparative Example 5 | 60 | 40 | — | — | 5 | 15 | 96 |
| Comparative Example 6 | 60 | 40 | Ni (3 g) | 7.50% | 5 | 15 | 94 |
| Comparative Example 7 | 60 | 40 | Al (3 g) | 7.50% | 5 | 15 | 124 |
| Comparative Example 8 | 60 | 40 | KS-6 (0.1) | 0.25% | 5 | 15 | 91 |
| Comparative Example 9 | 60 | 40 | KS-6 (0.5) | 0.50% | 5 | 15 | 90 |
| Comparative Example 10 | 60 | 40 | KS-6 (10.0) | 2.50% | 5 | 15 | 306 |

Comparative Example 13

40 g of copper powder (mean particle size of 0.1 μm, prepared according to H. T. Zhu et al., Journal of Crystal Growth, 270, 722 (2004)), 60 g of silver powder (mean particle size of 2.0 μm, commercially available from Ferro), 5 g of glass powder (mean particle size of 3.0 μm, commercially available from Okamoto Glass Co., Ltd.), and 1.0 g of carbon nanotube (specific surface area of about 200 m²/g, MWCNT commercially available from Seedchem Company Pty., Ltd.) were mixed with 15 g of the binder A in Example 1 by high-speed stirring. The mixture was then milled and dispersed by a three roll mill 3 times to form a conductive paste. The conductive paste was screen printed on a polysilicon substrate, and then sintered in an oven at 800° C. for 30 minutes to form an electrode on the substrate. The adhesive force between the electrode and the substrate was 5 B. The volume resistivity of the electrode is tabulated in Table 4.

TABLE 4

| | Silver powder, mean particle size of 2.0 μm (g) | Copper powder, mean particle size of 0.1 μm (g) | Additive | Additive ratio (on the basis of the copper powder) | Glass powder (g) | Binder (g) | Volume resistivity (μΩ-cm) |
|---|---|---|---|---|---|---|---|
| Comparative Example 11 | 60 | 40 | — | — | 5 | 15 | >10^4 |
| Comparative Example 12 | 60 | 40 | Carbon nanotube (0.5 g) | 1.25% | 5 | 15 | 5200 |
| Comparative Example 13 | 60 | 40 | Carbon nanotube (1.0 g) | 2.50% | 5 | 15 | 4850 |

As shown in Table 4, a copper powder having an overly small particle size would largely increase the volume resistivity of the electrode made from the conductive paste.

Comparative Example 14

80 g of copper powder (mean particle size of 10 μm, commercially available from DOWA), 20 g of silver powder (mean particle size of 2.0 μm, commercially available from Ferro), and 5 g of glass powder (mean particle size of 3.0 μm, commercially available from Okamoto Glass Co., Ltd.) were mixed with 15 g of the binder A in Example 1 by high-speed stiffing. The mixture was then milled and dispersed to form a conductive paste. The conductive paste was screen printed on a polysilicon substrate, and then sintered in an oven at 800° C. for 30 minutes to form an electrode on the substrate. The adhesive force between the electrode and the substrate was 5 B. The volume resistivity of the electrode is tabulated in Table 5.

Comparative Example 15

80 g of copper powder (mean particle size of 10 μm, commercially available from DOWA), 20 g of silver powder (mean particle size of 2.0 μm, commercially available from Ferro), 5 g of glass powder (mean particle size of 3.0 μm, commercially available from Okamoto Glass Co., Ltd.), and 1 g of graphene (specific surface area of about 500 m²/g, prepared according to H. A. Becerill, J. Mao, Z. Liu, R. M. Stoltenberg, Z. Bao, and Y. Chen, ACS Nano 2, 463 (2008)) were mixed with 15 g of the binder A in Example 1 by high-speed stirring. The mixture was then milled and dispersed to form a conductive paste. The conductive paste was screen printed on a polysilicon substrate, and then sintered in an oven at 800° C. for 30 minutes to form an electrode on the substrate. The adhesive force between the electrode and the substrate was 5 B. The volume resistivity of the electrode is tabulated in Table 5.

TABLE 5

| | Silver powder (g) | Copper powder (g) | Additive | Additive ratio (on the basis of the copper powder) | Glass powder (g) | Binder (g) | Volume resistivity (μΩ-cm) |
|---|---|---|---|---|---|---|---|
| Comparative Example 14 | 20 | 80 | 0 | 0 | 5 | 15 | >10^5 |

TABLE 5-continued

| | Silver powder (g) | Copper powder (g) | Additive | Additive ratio (on the basis of the copper powder) | Glass powder (g) | Binder (g) | Volume resistivity (μΩ-cm) |
|---|---|---|---|---|---|---|---|
| Comparative Example 15 | 20 | 80 | Graphene (1 g) | 1.25% | 5 | 15 | 7850 |

As shown in Table 5, an overly high ratio of the copper powder would increase the volume resistivity of the electrode made from the conductive paste.

The conductive paste compositions in the above embodiments can be applied in a sintering process at a high temperature for a silicon-based solar cell. The metal particles (copper/silver) with different particle sizes can be mixed to enhance the filling density of the conductive pastes and conductivity of the electrodes made from the conductive pastes. The carbon material with a high specific surface area (e.g. graphene or carbon nanotube) can be added to the conductive paste to enhance its anti-oxidation ability. The formula may reduce the amount of silver in the conductive pastes, thereby reducing cost. The disclosure may solve the conventional problem wherein the copper in the conductive paste is easily oxidized during high-temperature processes. As such, the conductive paste compositions of the disclosure are excellent in the high-temperature sintering process for preparing solar cells.

It will be apparent to those skilled in the art that various modifications and variations can be made to the disclosed methods and materials. It is intended that the specification and examples be considered as exemplary only, with a true scope of the disclosure being indicated by the following claims and their equivalents.

What is claimed is:

1. An unsintered conductive paste composition, comprising:
    100 parts by weight of uncoated copper powder;
    40 to 150 parts by weight of silver powder;
    0.1 to 3 parts by weight of carbon powder;
    1 to 5 parts by weight of glass powder; and
    5 to 15 parts by weight of binder,
        wherein the uncoated copper powder has a particle size greater than that of the silver powder, and
        wherein the carbon powder is carbon nanotube or graphene with a specific surface area of 200 $m^2$/g to 1000 $m^2$/g.

2. The unsintered conductive paste composition as claimed in claim 1, wherein the uncoated copper powder has a particle size of 1 μm to 10 μm.

3. The unsintered conductive paste composition as claimed in claim 1, wherein the silver power has a particle size of 0.1 μm to 2 μm.

4. The unsintered conductive paste composition as claimed in claim 1, wherein the binder comprises epoxy resin.

5. A method for manufacturing an electrode, comprising:
    applying the unsintered conductive paste composition as claimed in claim 1 onto a substrate; and
    sintering the unsintered conductive paste composition under a normal atmosphere to form an electrode on the substrate.

6. The method as claimed in claim 5, wherein the unsintered conductive paste composition is sintered at a temperature of 600° C. to 900° C.

* * * * *